(12) United States Patent
Suzuki

(10) Patent No.: US 10,910,027 B2
(45) Date of Patent: Feb. 2, 2021

(54) APPARATUSES AND METHODS FOR CONTROLLING WORD LINE DISCHARGE

(71) Applicant: MICRON TECHNOLOGY, INC., Boise, ID (US)

(72) Inventor: Takamasa Suzuki, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/382,856

(22) Filed: Apr. 12, 2019

(65) Prior Publication Data

US 2020/0327916 A1 Oct. 15, 2020

(51) Int. Cl.
| | |
|---|---|
| *G11C 8/08* | (2006.01) |
| *G11C 11/408* | (2006.01) |
| *G11C 5/14* | (2006.01) |
| *G11C 8/10* | (2006.01) |
| *G11C 8/14* | (2006.01) |

(52) U.S. Cl.
CPC ............... *G11C 8/08* (2013.01); *G11C 8/14* (2013.01); *G11C 11/4085* (2013.01); *G11C 11/4087* (2013.01)

(58) Field of Classification Search
CPC .......... G11C 8/08; G11C 8/14; G11C 11/4085
USPC .................................................. 365/230.06
See application file for complete search history.

(56) References Cited

U.S. PATENT DOCUMENTS

| 6,028,813 A | 2/2000 | Choi |
| 6,178,122 B1 | 1/2001 | Tomishima et al. |
| 6,337,832 B1 | 1/2002 | Ooishi et al. |
| 6,421,295 B1 * | 7/2002 | Mao ..................... G11C 11/4085 365/189.11 |
| 6,507,532 B1 | 1/2003 | Fujino et al. |
| 7,251,160 B2 | 7/2007 | Li et al. |
| 7,492,640 B2 | 2/2009 | Mokhlesi |
| 7,529,131 B2 | 5/2009 | Iwai et al. |
| 8,358,535 B2 | 1/2013 | Chae et al. |
| 8,395,936 B2 | 3/2013 | Li et al. |
| 8,804,446 B2 | 8/2014 | Okahiro |
| 8,891,325 B2 | 11/2014 | Choi et al. |

(Continued)

FOREIGN PATENT DOCUMENTS

KR 20140136766 A 12/2014

OTHER PUBLICATIONS

U.S. Appl. No. 16/584,746 titled "Apparatuses and Methods for Dynamic Timing of Row Pull Down Operations" filed Sep. 26, 2019, pp. all.

(Continued)

*Primary Examiner* — Ly D Pham
(74) *Attorney, Agent, or Firm* — Dorsey & Whitney LLP

(57) ABSTRACT

Apparatuses and methods for driving word driver lines in a gradual manner are disclosed herein. Word driver lines may be driven to intermediate potentials between high and low potentials. In some examples, the word driver lines may be driven in a step-wise manner. In some examples, the intermediate potential may be a bias voltage. The bias voltage may be provided by a bias voltage generator. One or more enable signals may be used to control the driving of the word driver line. In some examples, an address signal may be used to control the driving of the word driver line. Driving the word driver line in a gradual manner may cause a word line to discharge in a gradual manner in some examples.

9 Claims, 11 Drawing Sheets

(56) References Cited

U.S. PATENT DOCUMENTS

| | | | |
|---|---|---|---|
| 8,953,407 B2 | 2/2015 | Yun et al. | |
| 9,111,633 B2 | 8/2015 | Kim | |
| 9,373,378 B1 | 6/2016 | Chen | |
| 9,412,447 B1 | 8/2016 | Bertin et al. | |
| 9,418,711 B2 | 8/2016 | Ohgami | |
| 9,653,131 B1 | 5/2017 | Yamanaka et al. | |
| 9,824,746 B1* | 11/2017 | Lee | G11C 11/4074 |
| 9,922,726 B2 | 3/2018 | Choi | |
| 10,008,256 B1 | 6/2018 | Kim | |
| 10,014,063 B2 | 7/2018 | Tseng et al. | |
| 10,347,321 B1 | 7/2019 | Yamanaka et al. | |
| 10,490,256 B2 | 11/2019 | Jeong | |
| 10,529,400 B1 | 1/2020 | Mahatme et al. | |
| 10,614,893 B2 | 4/2020 | Miyazaki | |
| 10,636,469 B2 | 4/2020 | El-mansouri et al. | |
| 10,650,882 B2 | 5/2020 | Lin et al. | |
| 10,665,271 B2 | 5/2020 | Takeda et al. | |
| 10,672,443 B2 | 6/2020 | Gupta et al. | |
| 10,685,709 B2 | 6/2020 | Tanaka et al. | |
| 2002/0001215 A1* | 1/2002 | Fujisawa | G11O 5/025 365/51 |
| 2002/0051377 A1 | 5/2002 | Choi et al. | |
| 2002/0080677 A1* | 6/2002 | Watanabe | G11C 8/12 365/189.011 |
| 2003/0095438 A1 | 5/2003 | Hosogane | |
| 2004/0004899 A1 | 1/2004 | Choi | |
| 2004/0052146 A1 | 3/2004 | Sim | |
| 2004/0156260 A1* | 8/2004 | Lee | G11C 8/08 365/230.06 |
| 2004/0196719 A1 | 10/2004 | Aritomi et al. | |
| 2005/0128858 A1 | 6/2005 | Lee et al. | |
| 2005/0226086 A1* | 10/2005 | Sugawara | G11C 8/14 365/230.05 |
| 2006/0158953 A1* | 7/2006 | Takahashi | G11C 8/08 365/230.06 |
| 2006/0176758 A1 | 8/2006 | Chun | |
| 2007/0008807 A1 | 1/2007 | Jeong | |
| 2007/0030741 A1* | 2/2007 | Nii | G11C 8/08 365/189.11 |
| 2008/0031060 A1 | 2/2008 | Choi et al. | |
| 2008/0123463 A1* | 5/2008 | Matsubara | G11C 8/08 365/230.06 |
| 2009/0161418 A1 | 6/2009 | Yoon | |
| 2010/0046313 A1 | 2/2010 | Lee et al. | |
| 2010/0142306 A1 | 6/2010 | Nakamura et al. | |
| 2010/0149900 A1* | 6/2010 | Kitayama | G11C 11/4076 365/230.03 |
| 2010/0157716 A1 | 6/2010 | Lee | |
| 2011/0199837 A1 | 8/2011 | Reohr et al. | |
| 2011/0228624 A1 | 9/2011 | Kim et al. | |
| 2012/0120751 A1* | 5/2012 | Okahiro | G11C 7/08 365/207 |
| 2012/0147686 A1* | 6/2012 | Takayama | G11C 7/12 365/203 |
| 2012/0257437 A1* | 10/2012 | Seko | G11C 11/5678 365/148 |
| 2012/0287699 A1 | 11/2012 | Yun et al. | |
| 2012/0327108 A1 | 12/2012 | Kato et al. | |
| 2013/0135915 A1 | 5/2013 | Kim | |
| 2013/0215697 A1 | 8/2013 | Choi et al. | |
| 2013/0329495 A1 | 12/2013 | Shiino et al. | |
| 2014/0369149 A1 | 12/2014 | Park | |
| 2015/0098260 A1 | 4/2015 | Ohgami | |
| 2015/0255146 A1 | 9/2015 | Mochida | |
| 2015/0364174 A1 | 12/2015 | Ahn et al. | |
| 2016/0095178 A1 | 3/2016 | Kuang et al. | |
| 2017/0075595 A1 | 3/2017 | Maejima | |
| 2017/0103798 A1 | 4/2017 | Mochida | |
| 2017/0178751 A1 | 6/2017 | Choi | |
| 2017/0271021 A1 | 9/2017 | Futatsuyama et al. | |
| 2017/0273579 A1 | 9/2017 | Lee et al. | |
| 2018/0040362 A1 | 2/2018 | Kwak et al. | |
| 2018/0074896 A1 | 3/2018 | Takada et al. | |
| 2018/0166119 A1 | 6/2018 | Jeong | |
| 2018/0277182 A1 | 9/2018 | Inaba | |
| 2019/0013055 A1 | 1/2019 | Ohgami | |
| 2019/0035466 A1 | 1/2019 | Kim et al. | |
| 2019/0088333 A1 | 3/2019 | Shirakawa et al. | |
| 2019/0180812 A1 | 6/2019 | Sung et al. | |
| 2019/0189186 A1 | 6/2019 | Won et al. | |
| 2019/0214293 A1 | 7/2019 | Kim et al. | |
| 2019/0385649 A1 | 12/2019 | Kawamura | |
| 2020/0027439 A1 | 1/2020 | Choi et al. | |
| 2020/0075110 A1 | 3/2020 | Suzuki et al. | |
| 2020/0105352 A1 | 4/2020 | Tanzawa | |
| 2020/0111517 A1 | 4/2020 | Seo et al. | |
| 2020/0143890 A1 | 5/2020 | Lee | |
| 2020/0152249 A1* | 5/2020 | Kawamura | G11C 8/18 |
| 2020/0294571 A1 | 9/2020 | Shin | |
| 2020/0295021 A1 | 9/2020 | Maejima | |

OTHER PUBLICATIONS

U.S. Appl. No. 16/378,524 titled "Apparatuses and Methods for Controlling Driving Signals in Semiconductor Devices" filed Apr. 8, 2019, pp. all.

U.S. Appl. No. 16/450,696 titled "Apparatuses and Methods for Controlling Word Line Discharge" filed Jun. 24, 2019, pp, all.

U.S. Appl. No. 16/450,723 titled "Apparatuses and Methods for Controlling Word Line Discharge" filed Jun. 24, 2019, pp. all.

U.S. Appl. No. 16/450,737 titled "Apparatuses and Methods for Controlling Word Line Discharge" filed Jun. 24, 2019, pp. all.

U.S. Appl. No. 16/853,417, titled "Apparatuses and Methods for Providing Main Word Line Signal With Dynamic Well", dated Apr. 20, 2020, pp. all.

International Search Report/Written Opinion dated Jul. 24, 2020 for PCT Application No. PCT/US2020/026423, 9 pgs.

U.S. Appl. No. 17/038,604 titled "Apparatuses and Methods for Controlling Word Line Discharge" filed Sep. 30, 2020; pp. all.

\* cited by examiner

APPARATUSES AND METHODS FOR CONTROLLING WORD LINE DISCHARGE

BACKGROUND

A semiconductor memory device represented by a DRAM (Dynamic Random Access Memory) includes a memory cell array having memory cells disposed at intersections between word lines and bit lines. The semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FXL) selected by a second portion of the row address.

A memory cell array included in a semiconductor memory device such as the DRAM may be divided into a plurality of memory mats to reduce the wiring capacitance of the subword lines and the bit lines. Each memory mat includes respective main word lines, so that when the main word line is selected using the first portion of the row address, the memory mat to be selected is also determined at the same time.

The driving process of the subword lines is carried out by subword drivers, and when a subword line is driven to a high potential, the memory cell is coupled to the corresponding bit line. On the other hand, during a period in which the subword line is driven to a low potential, the memory cell and the bit line are kept in a cut-off state. As used herein, a low potential is a potential associated with a low logic level and/or inactive state. In driving subword lines to the high potential, relatively high voltages are provided to the subword drivers of a memory mat. As used herein, a high potential is a potential associated with a high logic level and/or active state. In contrast, in driving the subword line to a low potential, relatively low voltages are provided to the subword drivers of the memory mat.

Repeated access to a particular subword line, often referred to as a 'row hammer,' may cause an increased rate of data degradation in nearby subword lines. Reducing the effect of a row hammer event is desired.

DETAILED DESCRIPTION

Figure 1:
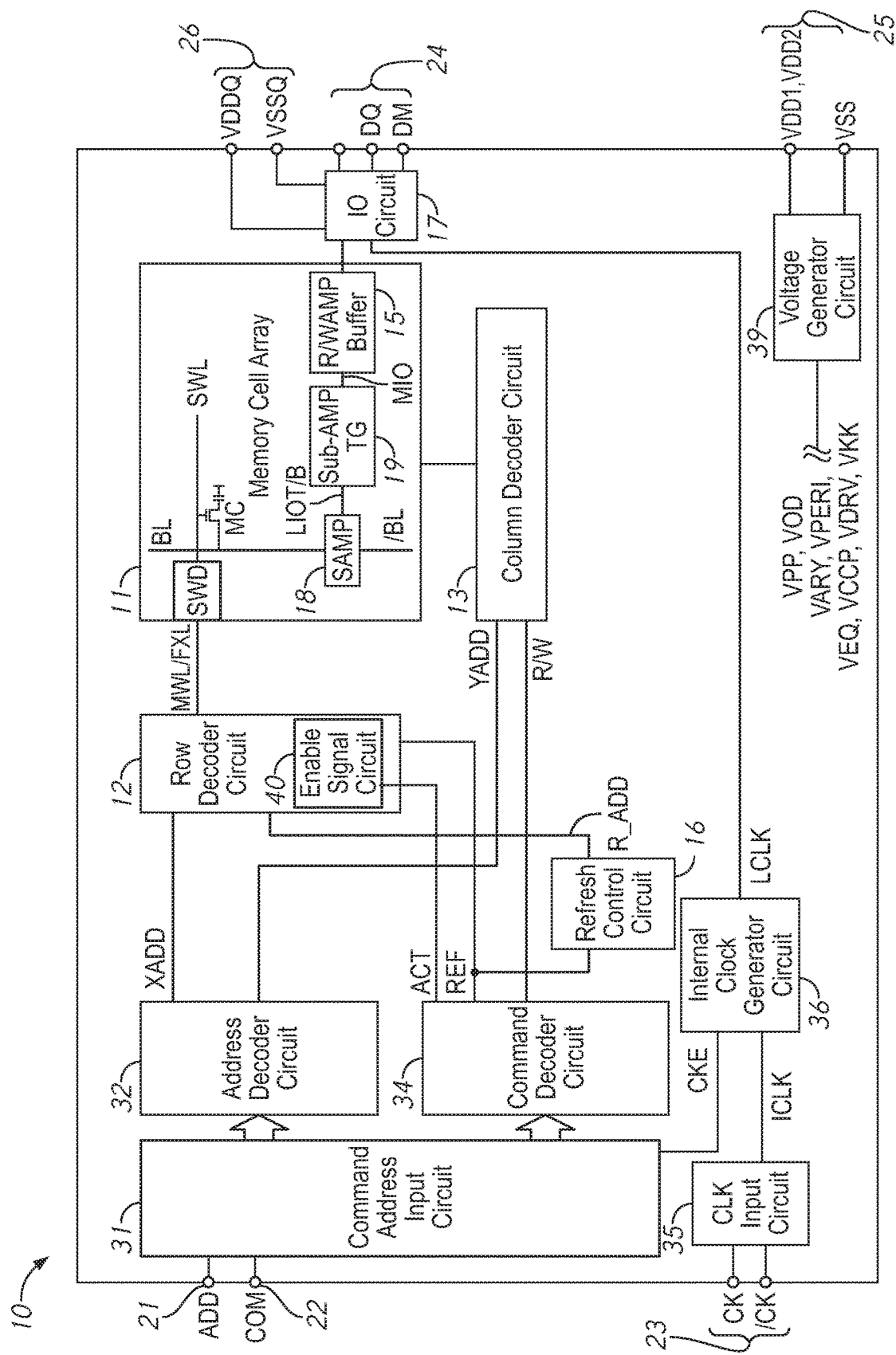
FIG. 1 is a block diagram of a semiconductor device according to an embodiment of the disclosure.

Certain details are set forth below to provide a sufficient understanding of examples of various embodiments of the disclosure. However, it will be clear to one having skill in the art that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

A semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FXL), which is selected by a second portion of the row address. The MWL may be driven by main word drivers (MWD) and the word driver line FXL may be driven by word drivers (FXD). Both the MWL and FXL must be driven to active states to select the desired subword line in the memory device.

Some research suggests that data degradation due to a row hammer event may be caused by a free electron generated in a back-gate region when a channel of a transistor disappears. Without being bound to a particular theory, row hammer effects may be mitigated by reducing the rate of channel dissipation in some applications. As described herein, the discharge of a subword line may be controlled. For example, the rate of discharge and/or the voltage to which the subwordline discharges may be controlled. As described herein, in some embodiments, the discharge of the subword line may be controlled by driving a word driver line FXL in a gradual manner, for example, in a step-wise manner. The subword line may discharge at a slower rate than if FXL were driven directly between active and inactive states. A rate of discharge of the subword line may be based, at least in part, on values of intermediate potentials of FXL between the active and inactive states in some embodiments. As described herein, the word driver line FXL may include multiple driving lines for providing multiple driving signals. In some embodiments, the driving signals of FXL may be driven to active and inactive states at different times. The timing of driving the FX signals may provide control over the discharge of the word line in some embodiments. In some embodiments, driving the word line FXL in a gradual manner may be used in combination with activating and deactivating the driving signals at different times to control the discharge of the subword line. In some applications, controlling the discharge of the subword line may reduce the effects of a row hammer event.

FIG. 1 is a block diagram of a semiconductor device 10 according to an embodiment of the disclosure. The semiconductor device 10 may be a dynamic random access memory (DRAM) in some embodiments of the disclosure.

The semiconductor device 10 includes a memory cell array 11. The memory cell array 11 includes a plurality of subword lines SWL and a plurality of bit lines BL that intersect with each other, with memory cells MC disposed at the intersections. The SWL may be driven by subword drivers SWD. For clarity, only one SWL, SWD, BL, and MC are shown in FIG. 1. A plurality of main word lines MWL and word driver lines FXL are coupled between a row decoder circuit 12 and the SWD. The selection of a main word line MWL and a word driver line FXL is carried out by the row decoder circuit 12, and the selection of the bit line BL is carried out by a column decoder circuit 13. Sense amplifiers 18 are coupled to corresponding bit lines BL and coupled to local I/O line pairs LIOT/B. Local IO line pairs LIOT/B are coupled to main IO line pairs MIOT/B via transfer gates TG 19 which function as switches to read/write amplifiers and buffers 15.

Turning to the explanation of a plurality of external terminals included in the semiconductor device 10, the plurality of external terminals includes address terminals 21, command terminals 22, clock terminals 23, data terminals 24, and power supply terminals 25 and 26.

The address terminals 21 are provided with an address signal ADD. The address signal ADD is provided to the address terminals 21 are transferred via a command/address input circuit 31 to an address decoder circuit 32. The address decoder circuit 32 receives the address signal ADD and supplies a decoded row address signal XADD to the row decoder circuit 12, and a decoded column address signal YADD to the column decoder circuit 13.

The command terminals 22 are provided with a command signal COM. The command signal COM may include one or more separate signals. The command signal COM input to the command terminals 22 is input to a command decoder circuit 34 via the command/address input circuit 31. The command decoder circuit 34 decodes the command signal COM to provide various internal command signals. For example, the command decoder circuit 34 may activate an activation signal ACT in response to an activation command and/or a refresh signal REF in response to a refresh command. For example, the internal commands may include a row command signal to select a word line and a column command signal, such as a read command or a write command, to select a bit line.

When a row activation command is issued and a row address is timely provided with the activation command, and a column address is timely provided with a read command, read data is read from a memory cell MC in the memory cell array 11 designated by these row address and column address. More specifically, the row decoder circuit 12 selects a main word line MWL, word driver line FXL, and subword line SWL indicated by the row address RA indicated by XADD so that the associated memory cell MC is subsequently coupled to the bit line BL. The read data DQ is output externally from the data terminals 24 via a read/write amplifier 15 and an input/output circuit 17. Similarly, when the row activation command is issued and a row address are timely provided with the activation command, and a column address is timely provided with a write command, the input/output circuit 17 may receive write data DQ at the data terminals 24. The write data DQ is provided via the input/output circuit 17 and the read/write amplifier 15 to the memory cell array 11 and written in the memory cell MC designated by the row address and the column address.

The row decoder circuit 12 may include an enable signal circuit 40 in some embodiments. The enable signal circuit 40 may receive an activation signal ACT from the command decoder circuit 34. In response to the activation signal ACT, the enable signal circuit 40 may provide one or more enable signals to one or more word drivers (not shown) included in the row decoder circuit 12. As will be explained in more detail, the enable signals may be used to drive a word driver line FXL in a gradual manner. In some applications, this may provide control over the discharge of a subword line SWL.

The device 10 may include a refresh control circuit 16 for carrying out refresh operations. The refresh operations may be an auto-refresh operation and/or other refresh operations. In some embodiments, a refresh command may be externally issued to the device 10 and provided to the command decoder circuit 34 which provides the command to the refresh control circuit 16 and row decoder circuit 12. In some embodiments, the refresh command may be periodically provided by a component of the device 10 (e.g., internally by the refresh control circuit 16 or the command decoder circuit 34). The refresh control circuit 16 may provide a refresh address R_ADD to the row decoder circuit 12, which may indicate a row address for performing a refresh operation.

The clock terminals 23 are provided with external clock signals CK and /CK, respectively. These external clock signals CK and /CK are complementary to each other and are provided to a clock input circuit 35. The clock input circuit 35 receives the external clock signals CK and /CK and provides an internal clock signal ICLK. The internal clock signal ICLK is provided to an internal clock generator 36 and thus a phase controlled internal clock signal LCLK is provided based on the received internal clock signal ICLK and a clock enable signal CKE from the command/address input circuit 31. Although not limited thereto, a DLL circuit can be used as the internal clock generator 36. The phase controlled internal clock signal LCLK is provided to the input/output circuit 17 and is used as a timing signal for determining an output timing of the read data DQ.

The power supply terminals 25 are provided with power supply voltages VDD1, VDD2, and VSS. These power supply voltages VDD1, VDD2, and VSS are provided to an internal voltage generator circuit 39. The internal voltage generator circuit 39 provides various internal voltages VPP, VOD, VARY, VPERI, VEQ, VCCP, VDRV, and VKK.

The internal potentials VCCP, VDRV, and VKK are potentials to be mainly used in the row decoder circuit 12. For example, VKK may be used as a low potential and VCCP may be used as a high potential in some embodiments. Although the detailed description thereof will be given later, the row decoder circuit 12 drives the main word line MWL and subword line SWL selected based upon the address signal ADD to a VCCP level corresponding to a high potential (e.g., 3.1 V) so that a cell transistor of the memory cell MC is turned on.

The internal potential VARY and VEQ is a potential to be used by the sense amplifier 18, transfer gates 19 and/or read/write amplifiers 15. When the sense amplifier 18 is activated, the read data read out is amplified by driving one of the paired bit lines to a VARY level with the other one being driven to a VSS level. The internal potential VPERI is used as a power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor device 10.

The power supply terminals 26 are provided with power supply voltages VDDQ and VSSQ. These power supply voltages VDDQ and VSSQ are provided to the input/output circuit 17. The power supply voltages VDDQ and VSSQ may be the same voltages as the power supply voltages VDD2 and VSS that are provided to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
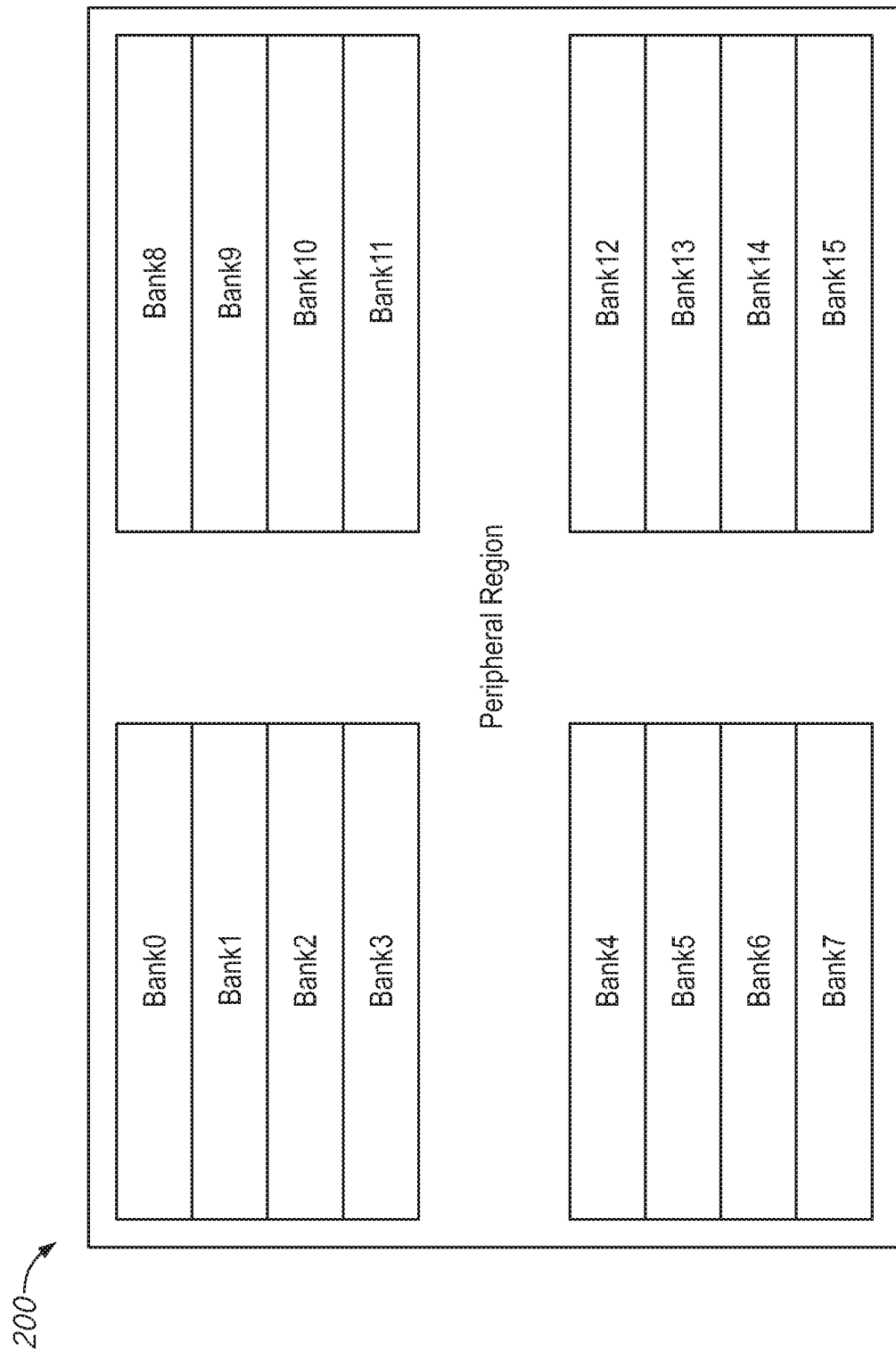
FIG. 2 is a diagram for a layout of a semiconductor device according to an embodiment of the disclosure.

FIG. 2 is a diagram for an example layout of a memory cell array of a semiconductor device according to an embodiment of the disclosure. In some embodiments of the disclosure, the memory cell array may be included in the memory cell array 11 of the semiconductor device 10 shown in FIG. 1.

The memory cell array 200 of the example shown in FIG. 2 is divided into sixteen banks BK0 to BK15. A row decoder circuit (e.g., row decoder circuit 12 of FIG. 1; not shown in FIG. 2) may be disposed between adjacent banks and/or in the peripheral circuit region PE. In the peripheral circuit region PE, various peripheral circuits and external terminals may be disposed (not shown in FIG. 2).

Figure 3:
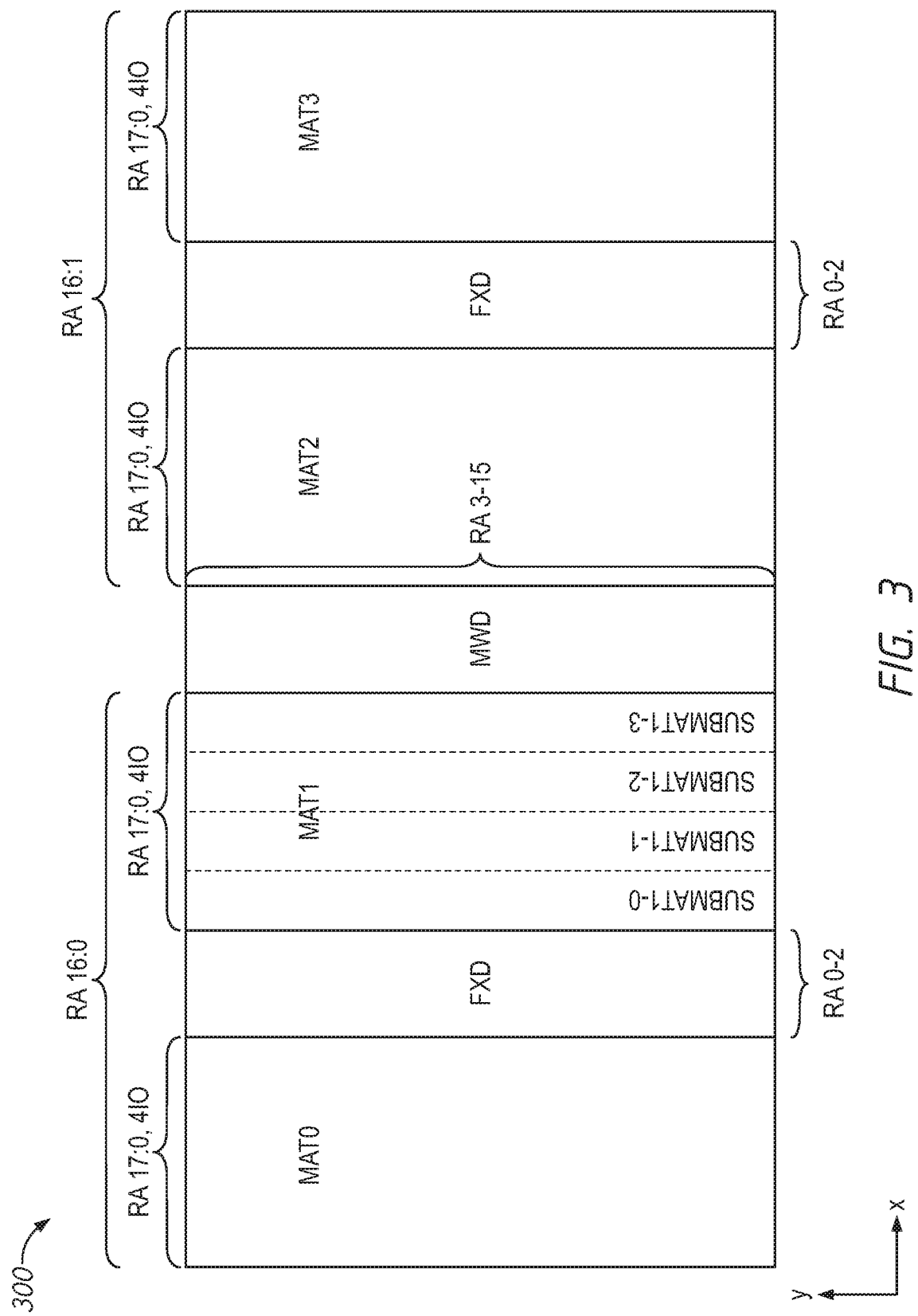
FIG. 3 is a diagram for a configuration of a bank of a memory cell array of a semiconductor device according to an embodiment of the disclosure.

FIG. 3 is a diagram for an example configuration of a bank 300 of a memory cell array according to an embodiment of the disclosure. The banks BK0 to BK15 of FIG. 2 may each include the configuration of the bank 300 of FIG. 3 in some embodiments of the disclosure. In some embodiments, the bank 300 may be included in memory cell array 11 of the semiconductor device 10 shown in FIG. 1.

As shown in FIG. 3, the bank 300 includes a plurality of memory mat regions MAT0-3. In the example shown in FIG. 3, the bank 300 has four memory mat regions, but the bank 300 could include more or fewer memory mat regions in other examples. As indicated by the dotted lines in memory mat region MAT1, each memory mat region may be divided into multiple sub-regions SUBMAT1-0-3. While the example shown in FIG. 3 includes four sub-regions, memory mat regions MAT0-3 may include more or fewer sub-regions in other examples. Each sub-region SUBMAT1-0-3 may include a plurality of memory mats (e.g., 32, 64, 128) aligned in the Y-direction. In some embodiments, the plurality of memory mats in a sub-region may be further sub-divided into sets. For example, SUBMAT1-0 may include 64 memory mats and the memory mats may be organized into eight sets of eight. For clarity, the individual memory mats are not shown in FIG. 3. The memory mats of each sub-region SUBMAT1-0-3 may be associated with a corresponding IO (e.g., DQ pad) in some embodiments.

The subword driver operations are controlled by a row decoder circuit (not shown in FIG. 3), for example, the row decoder circuit 12 of FIG. 1. When a row address RA is input thereto, the row decoder selects a subword line by activating an appropriate main word driver (MWD) and an appropriate word driver (FXD) indicated by the row address RA. In the example shown in FIG. 3, one block is shown for the main word driver MWD, however, the main word driver MWD block may include a plurality of main word drivers MWDs. Similarly, two blocks are shown for the word drivers FXDs, but each word driver FXD block may include a plurality of word drivers FXDs. For example, if each memory mat region MAT includes four sub-regions and each sub-region includes 64 memory mats, the main word driver MWD block may include 128 MWD, each configured to activate a corresponding main word line (MWL). Continuing this example, each word driver FXD block may include eight word drivers FXDs, each configured to activate a corresponding word driver line (FXL). In the example shown in FIG. 3, bits 3-15 of the row address RA encode the main word line MWL and bits 0-2 of the row address RA encode the word driver line FXL. However, other encoding schemes may be used.

Figure 4:
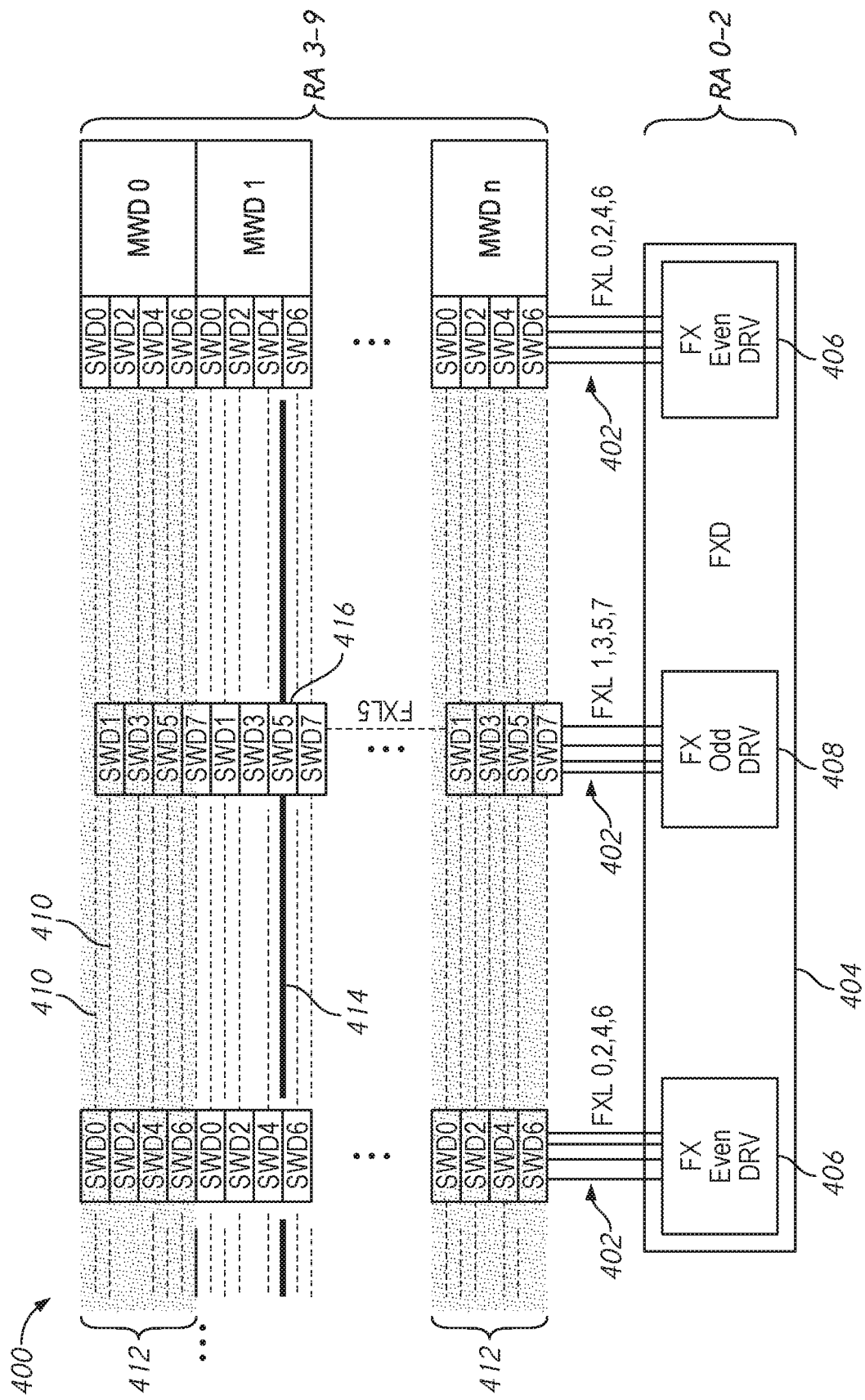
FIG. 4 is a schematic diagram of a portion of a bank of a memory cell array according to an embodiment of the disclosure.

FIG. 4 is a schematic diagram of a portion of a bank 400 according to an embodiment of the disclosure. In some embodiments of the disclosure, the portion of the bank 400 shown in FIG. 4 may be included in the bank 300 of FIG. 3, the memory cell array 200 of FIG. 2, and/or the memory cell array 11 of FIG. 1.

The subword lines are adjacent to each other, and driven by subword drivers SWD0-7 of different subword driver groups. Corresponding main word signals (not shown), driving signals FX, and low potential VKK/Gnd (not shown) are provided to the subword drivers SWD0-7. In some embodiments, the main word signals and the driving signals FX are signals that may be provided by main word drivers MWD0-N and word drivers FXD 404, respectively, included with the row decoder circuit, such as row decoder circuit 12 shown in FIG. 1, based upon the row address RA as described with reference to FIG. 3. The main word signal is provided to the subword drivers SWD0-7 over a main word line (not shown in FIG. 4), and the driving signals FX are provided to the subword drivers SWD0-7 over word driver lines 402.

A main word line MWL may extend over array regions of a respective memory mat (e.g., a memory mat in SUBMAT1-0 in FIG. 3) to provide the main word signal to the subword driver groups of the memory mat to activate the subword drivers SWD0-7 of the memory mat. That is, when a main word driver MWD is activated, it may provide active main word signals to all the subword drivers SWD0-7 of the mat. As will be described below, the driving signals FX include complementary signals FXT and FXF. Each word driver line 402 of word driver FXD 404 provides driving signals FX to at least one subword driver SWD in each mat. In the example shown in FIG. 4, the word driver FXD 404 includes even word drivers 406 and odd word drivers 408. The even word drivers 406 provide respective driving signals to even numbered subword drivers SWD0, SWD2, SWD4, and SWD6, of each memory mat and odd word drivers 408 provide respective driving signals to odd numbered subword drivers SWD1, SWD3, SWD5, and SWD7 of each memory mat. However other arrangements may be used in other examples. In the example shown in FIG. 4, each line of the word driver FXD may be coupled to a corresponding subword driver SWD0-7 in each memory mat. For example, FXL 5 may be coupled to the subword driver SWD5 of each memory mat.

In the example operation shown in FIG. 4, a row address RA has indicated MWD1 should be activated (e.g., selected) and odd word driver FXD 408 associated with word driver line FXL 5 should be activated (e.g., selected). As shown by the shaded regions 412, subword lines 410 associated with the main word drivers MWD0, MWDn remain inactive, even the subword lines associated with word driver line FXL 5. However, the subword line 414 driven by subword driver SWD5 416 associated with activated MWD1 and FXL 5 is activated to allow access to memory cells along subword line 414. Thus, a selected subword line SWL of the selected memory mat associated with MWD1 is driven to the high potential by the corresponding activated subword driver SWD5. In some examples, the other subword drivers SWD of the selected memory mat drive the respective unselected subword lines SWL to the low potential to remain inactive. Subword drivers SWD of unselected memory mats (e.g., memory mats associated with MWD0 and MWDn) remain deactivated, and the subword lines SWL of the unselected memory mats MAT are not provided a voltage in some examples. That is, while a subword driver SWD may be enabled by an active main word driver MWD or an active word driver FXD, in order to be activated, a subword line SWL must be associated with a subword driver SWD coupled to an activated word driver FXD and an activated main word driver MWD. After the memory cells of the selected subword line SWL have been accessed, the selected subword line SWL is then discharged to the low potential by deactivating the MWD and/or FXD as described herein.

According to some embodiments of the disclosure, the subword line SWL is discharged in a controlled manner. For example, a rate of discharge of the subword line SWL may be controlled. In some embodiments, the discharge of the subword line SWL may be controlled by activating a word driver FXD, such as the word drivers shown in FIGS. 3 and 4 and discussed in reference to FIG. 1, to drive a word driver line FXL in a gradual manner, for example, in a step-wise manner. Driving the word driver line FXL in a gradual manner may include driving FX to intermediate potentials between active and low potentials. For example, intermediate potentials may be between Gnd and VCCP. In other examples, intermediate potentials may be between VKK and VCCP. In another example, a voltage to which the subword line SWL discharges to may be controlled. In some embodiments, the driving signals FX may be activated and deactivated at different times to discharge the subword line to an intermediate subword line voltage. The intermediate subword line voltage may be a voltage between a high potential (e.g., VCCP) and a low potential (e.g., Gnd, VKK). Driving a word driver line FXL in a gradual manner and/or changing the timing of activation of driving signals FX may cause the subword line SWL to discharge at a slower rate than if driving signals FX were driven directly between active and inactive states at the same time.

Figure 5:
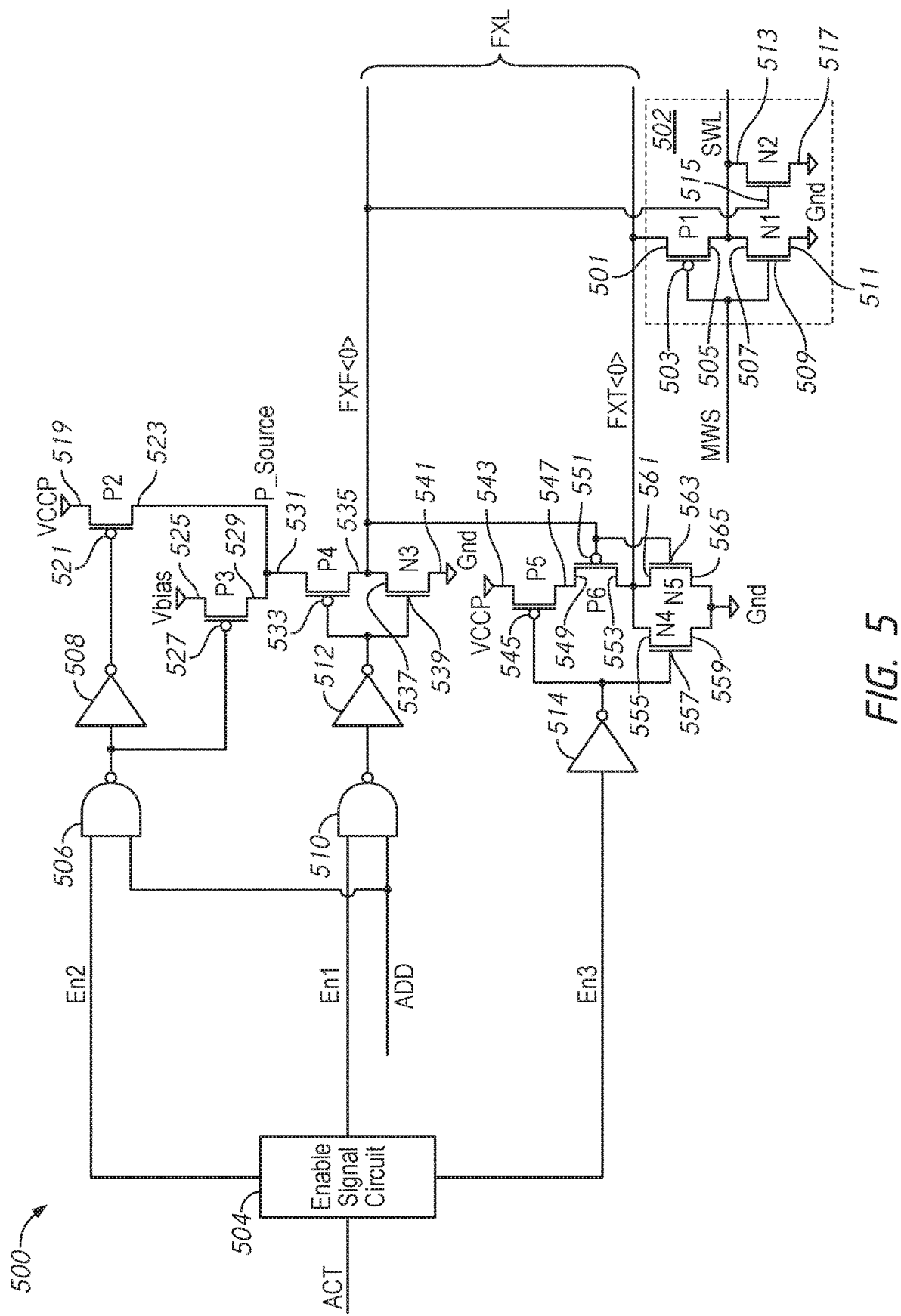
FIG. 5 is a circuit diagram of a word driver according to an embodiment of the disclosure.

FIG. 5 is a circuit diagram of a word driver FXD 500 according to an embodiment of the disclosure. The FXD 500 may be included in word drivers FXD shown in FIG. 3 and/or word driver 404 shown in FIG. 4 in some embodiments. The FXD 500 may be included in a row decoder, such as row decoder 12 in FIG. 1. In some embodiments, FXD 500 may be included in a peripheral region of a memory array, such as memory array 300 shown in FIG. 3. For context, a subword driver SWD 502 and an enable signal circuit 504 associated with the FXD 500 are also shown. The SWD 502 may be used to implement the subword drivers SWD0-7 shown in FIG. 4 in some embodiments. The enable signal circuit 503 may be used to implement the enable signal circuit 40 shown in FIG. 1 in some embodiments.

In the embodiment shown in FIG. 5, the SWD 502 includes a P-channel type field effect transistor P1 and N-channel type field effect transistors N1 and N2. The transistors P1 and N1 are series-coupled to each other at nodes 505 and 507, respectively, and a main word signal MWS is provided to the gate electrodes 503 and 509, respectively. A driving signal FXT is provided to the node 501 (e.g., drain or source) of the transistor P1, and a low potential is provided to the node 511 (e.g., drain or source) of the transistor N1. While the examples herein describe the low potential as Gnd, other potentials may also be used (e.g., a negative voltage, VKK). The nodes (e.g., drains or sources) of the transistors P1 and N1 are coupled to subword line SWL. A driving signal FXF is provided to the gate 515 of the transistor N2, with its node 513 (e.g., drain or source) being coupled to the subword line SWL, and the low potential is provided to the node 517 (e.g., drain or source). As previously described, the main word signal MWS is provided by a main word driver MWD and the driving signals FXT and FXF are provided by FXD 500 on word driver lines FXL.

The main word signal MWS is a signal that becomes a low level when selected, and the driving signals FXT and FXF are signals that respectively become a high level and a low level when selected. The driving signals FXT and FXF are complementary signals. When the main word signal MWS and the driving signals FXT and FXF are activated (e.g., MWS and FXF are low and FXT is high), transistors N1 and N2 are not activated, but the transistor P1 is activated to provide the FXT signal and the corresponding subword line SWL is activated. In contrast, when the main word signal MWS is in the inactive state, and either of the driving signals FXT and FXF is also in the inactivated state, the corresponding subword line SWL is inactivated. The potential to which the subword line SWL is driven for active and inactive states may be based, at least in part, on a potential of the FXT and/or FXF signals. For example, when FXT is driven to VCCP and FXF is driven to Gnd, subword line SWL may be driven to VCCP when activated by MWS.

Returning to the FX driver (e.g., FXD 500), various control signals may be provided to control the operation of the FXD 500. FXD 500 may receive an address signal ADD, and enable signals En1, En2, En3. The address signal ADD may be provided by an address decoder circuit, such as address decoder circuit 32 shown in FIG. 1 or a refresh control circuit, such as refresh control circuit 16 shown in FIG. 1. As noted in FIGS. 3 and 4, row address bits RA0-2 may be used to indicate one of eight FX drivers to be selected (e.g., activated). FXD 500 may be one of the eight FX drivers in some examples. The enable signals En1, En2, En3 may be provided by an enable signal circuit 504. The enable signal circuit 504 may activate one or more of the enable signals En1, En2, En3 responsive to an active activation signal ACT. In some embodiments, the activation signal may be provided by a command decoder circuit, such as command decoder circuit 34 in FIG. 1.

The address signal ADD and second enable signal En2 may be provided as inputs to a NAND gate 506. The output of the NAND gate 506 may be provided as an input to inverter 508. The address signal ADD and first enable signal En1 may be provided to a second NAND gate 510. The output of the second NAND gate 510 may be provided to a second inverter 512. The third enable signal En3 may be provided as an input to inverter 514.

The word driver may include a P-channel transistor P2. A node (e.g., source or drain) 519 of P2 may be coupled to a potential VCCP. A gate 521 of P2 may receive an output of the inverter 508. A node 523 of P2 may be coupled to a node 529 of P-channel transistor P3 and a node 531 of P-channel transistor P4. A node 525 of P3 may be coupled to a bias voltage $V_{bias}$. A gate 527 of P3 may receive an output of NAND gate 506. A gate 533 of P4 may receive an output of inverter 512. A node 535 of P3 may be coupled to a node 537 of N-channel transistor N3. Driving signal FXF may be provided between the nodes 535 and 537. A gate 539 of N3 may also receive the output of inverter 512. A node 541 of N3 may be coupled to a low potential. In the example shown in FIG. 5, ground Gnd is used as the low potential.

A P-channel transistor P5 may have a node 543 coupled to a potential VCCP. A gate of P5 may receive an output of inverter 514. A node 547 of P5 may be coupled to a node 549 of P-channel transistor P6. A gate 551 of P6 may receive driving signal FXF. A node 553 of P6 may be coupled to a node 555 of N-channel transistor N4 and a node 561 of N-channel transistor N5. Driving signal FXT may be provided between nodes 553 and 561. A gate 557 of N4 may receive the output of inverter 514. A node 559 of N4 may be coupled to a low potential, for example, Gnd. A gate 563 of N5 may receive driving signal FXF. A node 565 of N5 may be coupled to a low potential, Gnd.

When the address signal ADD is inactive (e.g., low), indicating FXD 500 is not selected (e.g., not activated), the outputs of NAND gates 506, 510 are high, regardless of the state of enable signals En1, En2, En3. As a result, transistors P2 and P4 are activated and transistors P3 and N3 are not activated. Thus, FXF is driven to an inactive (e.g., high) state, which in the example shown in FIG. 5 is VCCP. When FXF is inactive, transistor N5 is activated and transistor P6 is not activated. This drives FXT to an inactive (e.g., low) state. The inactive driving signal FXF further deactivates transistor N2, driving the subword line SWL to an inactive state. Accordingly, when the FXD 500 is not selected by address signal ADD (e.g., address signal ADD is inactive), the corresponding subword line SWL is in an inactive state. Similarly, when enable signals En1, En2 are in inactive states, FXF and FXT remain in inactive states regardless of the state of the address signal ADD and enable signal En3.

When the address signal ADD is active (e.g., high), indicating FXD 500 is selected, the states of FXT and FXF may vary depending on the states of enable signals En1, En2, and En3. The potential of the states may also depend on the enable signals. The states of enable signals En1, En2, En3 may be determined, based at least in part, on a state of the activation signal ACT. When enable signal En1 is active (e.g., high) and enable signals En2 and En3 are inactive (e.g., low), the output of NAND gate 510 is low. As a result, transistor N3 is activated and transistor P4 is not activated, driving FXF to an active state. However, because enable signal En3 is low, transistor N4 is activated and transistor P5 is not activated. Thus, FXT is driven to an inactive state. When both enable signals En1 and En3 are active, transistor P5 is activated and transistor N4 is not activated, allowing FXT to reach an active state. Thus, in some embodiments, FXT may be active only when enable signal En3 is active.

Continuing with the example where the address signal ADD is active, when enable signals En1 and En2 are both active, transistor P3 may be activated and transistor P2 may not be activated responsive to an active enable signal En2. However, because transistor N3 is activated and transistor P4 is not activated responsive to enable signal En1, driving signal FXF remains active low. When enable signal En3 is inactive while En1 and En2 are both active, transistor P5 is inactive and the transistor N4 is active causing FXT to be at the low potential, Gnd. With the transistor P1 activated by the active (low) main word signal MWS, the subword line SWL begins to discharge through transistor P1 from the high potential VCCP to an intermediate subword line voltage, which may be greater than the low potential Gnd. For example, the subword line SWL may discharge from VCCP to a potential related to the threshold voltage of the transistor P1. Following when the enable signal En3 becomes inactive, when enable signal En1 is inactive and enable signal En2 is active, transistor P4 is activated and transistor N3 is not activated. As a result, FXF is driven to bias voltage $V_{bias}$. In some embodiments, $V_{bias}$ may be a potential having a value between the low potential, Gnd, and the high potential VCCP.

Driving FXF to an intermediate potential may allow a discharge time of subword line SWL to be increased. For example, when driving signal FXT is in an inactive state (e.g., at a low potential, Gnd) and FXF is also in an inactive state (e.g., at a high potential VCCP), subword line is driven to a low potential, Gnd. However, when FXT is driven to the low potential, Gnd and FXF is driven to bias voltage $V_{bias}$, transistor N2 may provide a resistance through which subword line SWL discharges. Accordingly, by driving FXF from Gnd to $V_{bias}$ and then to VCCP, subword line SWL may discharge from VCCP to the low potential at a slower rate than if FXF were driven directly from a low potential to VCCP.

Figure 6:
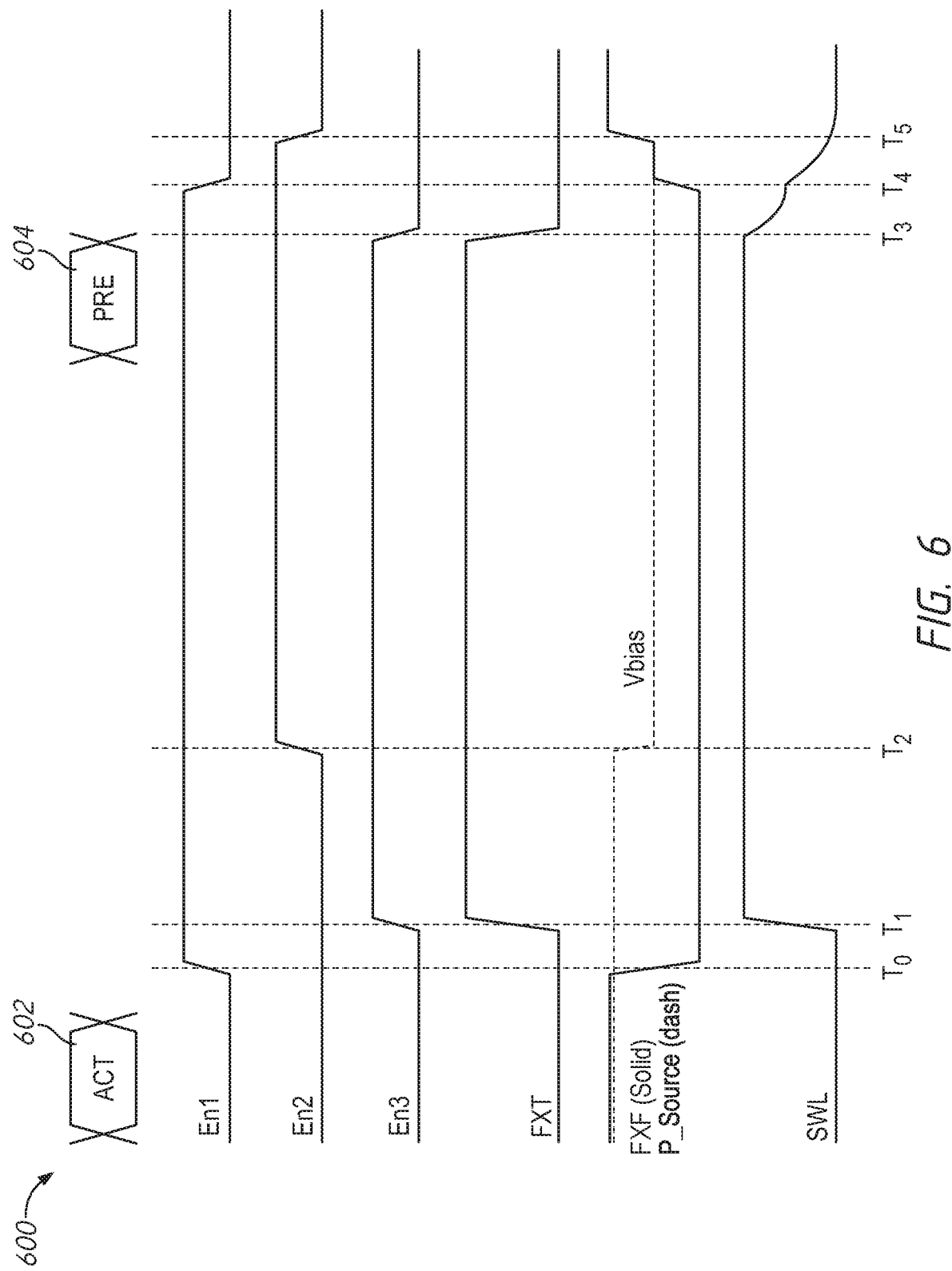
FIG. 6 is a timing diagram of various signals during operation of a driver circuit according to an embodiment of the disclosure.

FIG. 6 is a timing diagram 600 of various signals during an operation of a driver circuit according to an embodiment of the disclosure. In some embodiments of the disclosure, the driver circuit of FIG. 5 may be operated according to the example operation of timing diagram 600. The timing diagram 600 will be described with reference to the driver circuit of FIG. 5. However, the example of FIG. 6 is not limited to the specific embodiment of the FXD 500.

Timing diagram 600 shows the states of enable signals En1, En2, and En3, driving signals FXT and FXF, a subword line SWL, and P_source, a voltage at a node of a P-channel type field effect transistor coupled to Vbias (e.g., node 529 of P3 in FIG. 5). Although not shown in FIG. 6, it is assumed that an address signal ADD is active during the operation shown in timing diagram 600.

At some time before T0, an activation command 602 is received by a memory device that includes the word driver. An internal activation signal ACT may transition to an active state. The activation signal ACT may be received by enable signal circuit 504, which may activate enable signals En1, En2, and En3 in response to the activated activation signal ACT. Around T0, the enable signal circuit 504 may transition En1 to an active (e.g., high) state. As mentioned previously, this may cause the output of NAND gate 510 to transition to a low logic state. The output of the NAND gate 510 is inverted by inverter 512, which activates transistor N3 and does not activate transistor P4. Because En2 remains low at T0, transistor P2 is activated and P3 is not activated. Thus, FXF is driven to an active (e.g., low) state and P-Source remains at a potential equal to VCCP.

Around T1, the enable signal circuit 504 transitions En3 to an active (e.g., high) state. En3 may be inverted by inverter 514, which activates transistor P5 and deactivates transistor N4. Because FXF is active low, transistor P6 is also activated and transistor N5 is inactivated. Thus, FXT is driven to an active (e.g., high) state. As a result, SWL is driven to an active (e.g., high) state.

Around T2, the enable signal circuit 504 transitions En2 to an active (e.g., high) state. The active En2 signal may cause the output of NAND gate 510 to transition to a low logic state. This may activate transistor P3 and deactivate transistor P2. This may cause P_source to transition to a potential equal to $V_{bias}$. In the example shown in FIG. 6, $V_{bias}$ has a potential greater than Gnd and lower than VCCP.

Prior to T3, a precharge command 604 may be received by the memory device. Responsive to the pre-charge command 604, the activation signal ACT may transition to an inactive state. Responsive to the inactive activation signal ACT, the enable signal circuit 504 may deactivate (e.g., transition to an inactive state) the enable signals En1, En2, En3.

Around T3, the enable signal circuit 504 may transition En3 to an inactive state. As discussed previously with reference to FIG. 5, when En3 is inactive, FXT may be driven to an inactive (e.g., low) state. Due to the inactive FXT, the subword line SWL is no longer coupled to VCCP (by FXT) via transistor P1, but is instead coupled to a low potential via transistor P1. Accordingly, SWL begins to discharge from VCCP through transistor P1 to an intermediate subword line voltage, which may be a potential less than VCCP but greater than the low potential. For example, the SWL begins to discharge from VCCP until the potential of SWL is equal to a potential of the main word line MWL plus the threshold voltage $V_{tp}$ of transistor P1. Because FXF is still active low, transistor N2 is inactive, so the rate of discharge of SWL is limited by P1.

Around T4, the enable signal circuit 504 may transition En1 to an inactive state. This may activate transistor P4 and deactivate transistor N3. FXF is driven to $V_{bias}$ via transistors P3 and P4. $V_{bias}$ may be applied to the gate 515 of transistor N2. Increasing the voltage applied to N2 to Vbias may permit the subword line SWL to discharge through N2, permitting SWL to continue to discharge from the voltage greater than the low potential (e.g., MWL plus Vtp) toward Gnd. The rate of discharge may be based, at least in part, on a value of $V_{bias}$.

Around T5, the enable signal circuit 504 may transition En2 to an inactive state. This may activate transistor P2 and deactivate transistor P3, driving FXF to an inactive (e.g., high) state and P_source to VCCP. The inactive FXF signal may activate N2, which may permit SWL to discharge to Gnd with little resistance.

The word driver embodiment described in reference to FIG. 5 drives driving signal FXF to $V_{bias}$ via a P-channel transistor (e.g., transistor P4 in FIG. 5). However, in other embodiments, driving signal FXF may be driven to Vbias via an N-channel transistor.

Figure 7:
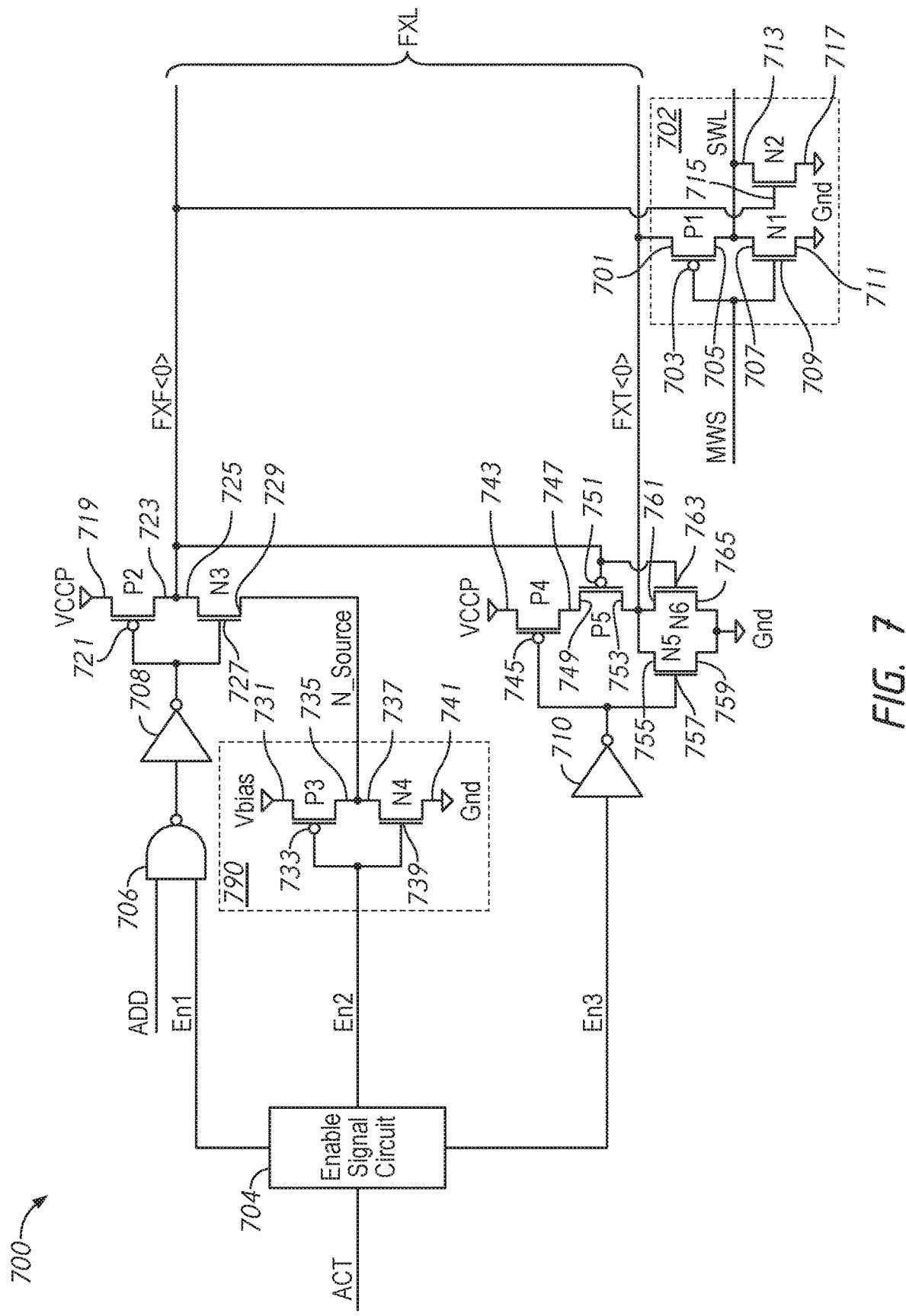
FIG. 7 is a circuit diagram of a word driver according to an embodiment of the disclosure.

FIG. 7 is a circuit diagram of a word driver FXD 700 according to an embodiment of the disclosure. The FXD 700 may be included in word drivers FXD shown in FIG. 3 and/or word driver 404 shown in FIG. 4 in some embodiments. The FXD 700 may be included in a row decoder, such as row decoder 12 in FIG. 1. In some embodiments, FXD 700 may be included in a peripheral region of a memory array, such as memory array 300 shown in FIG. 3. For context, a subword driver SWD 702 and an enable signal circuit 704 associated with the FXD 700 are also shown. The SWD 702 may be used to implement the subword drivers SWD0-7 shown in FIG. 4 in some embodiments. The enable signal circuit 704 may be used to implement the enable signal circuit 40 shown in FIG. 1 in some embodiments.

Various control signals may be provided to control the operation of the FXD 700. FXD 700 may receive an address signal ADD, and enable signals En1, En2, En3. The address signal ADD may be provided by an address decoder circuit, such as address decoder circuit 32 shown in FIG. 1 or a refresh control circuit, such as refresh control circuit 16 shown in FIG. 1. As noted in FIGS. 3 and 4, row address bits RA0-2 may be used to indicate one of eight FX drivers to be selected (e.g., activated). FXD 700 may be one of the eight FX drivers in some examples. The enable signals En1, En2, En3 may be provided by an enable signal circuit 704. The enable signal circuit 704 may activate one or more of the enable signals En1, En2, En3 responsive to an active activation signal ACT. In some embodiments, the activation signal may be provided by a command decoder circuit, such as command decoder circuit 34 in FIG. 1.

The address signal ADD and enable signal En1 may be provided as inputs to a NAND gate 706. The output of the NAND gate 706 may be provided to an inverter 708. Enable signal En3 may be provided as an input to inverter 710. FXD 700 may include a P-channel transistor P2 having a node 719 coupled to VCCP and a node 723 coupled to a node 725 of an N-channel transistor N3. Driving signal FXF may be provided between nodes 723 and 725. Both gate 721 of P2 and gate 727 of N3 may receive the output of inverter 708. A node 729 of N3 may be coupled to node 735 of P-channel transistor P3 and node 737 of N-channel transistor N4. A node 731 of P3 may be coupled to a bias voltage $V_{bias}$. A node 741 of N4 may be coupled to a low potential, for example, Gnd. Both gate 733 of P3 and gate 739 of N4 may receive enable signal En2.

FXD 700 may include P-channel transistor P4. A node 743 of P4 may be coupled to VCCP and a node 747 of P3 may be coupled to a node 749 of P-channel transistor P5. The gate 745 of P4 may receive an output from inverter 710. The gate 751 of P5 may receive driving signal FXF. Node 753 of P5 may be coupled to node 755 of N-channel transistor N5 and node 761 of N-channel transistor N6. Driving signal FXT may be provided between nodes 753 and 761. Gate 757 of N5 may receive the output of inverter 710 and a node 759 of N5 may be coupled to the low potential, Gnd. A gate 763 of N6 may receive driving signal FXF and a node 765 of N6 may be coupled to low potential, Gnd.

Similar to the embodiment shown in FIG. 5, FXT may only be driven to an active (e.g., high) state when FXF is active and enable signal En3 is active. When enable signal En3 is active, transistor P4 is activated and N5 is not activated. When FXF is active, transistor P5 is activated and transistor N6 is not activated, and FXT is driven to VCCP.

When En3 is inactive and En1 and En2 are active, FXT may be inactive and FXF may remain active. Thus, transistor N5 may be active and transistor N2 may be inactive. With the transistor P1 activated by the active (low) main word signal MWS, the subword line SWL begins to discharge through transistor P1 from the active potential VCCP to an intermediate subword line voltage, which may be greater than the low potential, Gnd. The intermediate subword line voltage may be based, at least in part, on a threshold voltage of P1.

Similar to the embodiment shown in FIG. 5, FXF may only be driven to an active (e.g., low) state when address signal ADD is active (e.g., FXD 700 is selected). However, unlike the embodiment in FIG. 5, enable signal En2 may also be enabled to drive FXF to an active state. When both address signal ADD and enable signal En1 are active, transistor P2 is not activated and transistor N3 is activated. When enable signal En2 is active, transistor P3 is not activated and N4 is activated. Thus, FXF is driven to an inactive state via transistors N3 and N4.

When the address signal ADD and enable signals En1 and En2 are active, FXF may be driven to a low potential, Gnd. In contrast, when address signal ADD and enable signal En1 are active and enable signal En2 is inactive, transistor N4 is not activated and transistor P3 is activated. As a result, FXF is driven to the bias voltage $V_{bias}$ via transistors P3 and N3. In some embodiments, $V_{bias}$ may be a potential having a value between the low potential, Gnd, and the high potential VCCP.

Driving FXF to an intermediate potential may allow a discharge time of subword line SWL to be increased. For example, when driving signal FXT is in an inactive state (e.g., at a low potential, Gnd) and FXF is also in an inactive state (e.g., at a high potential VCCP), subword line SWL is driven to a low potential, Gnd. However, when FXT is driven to the low potential, Gnd and FXF is driven to bias voltage $V_{bias}$, transistor N2 may present a resistance through which subword line SWL discharges. Accordingly, subword line SWL may discharge to the low potential at a slower rate than if FXF were driven directly to VCCP. The rate of discharge may be based, at least in part, on $V_{bias}$.

Figure 8:
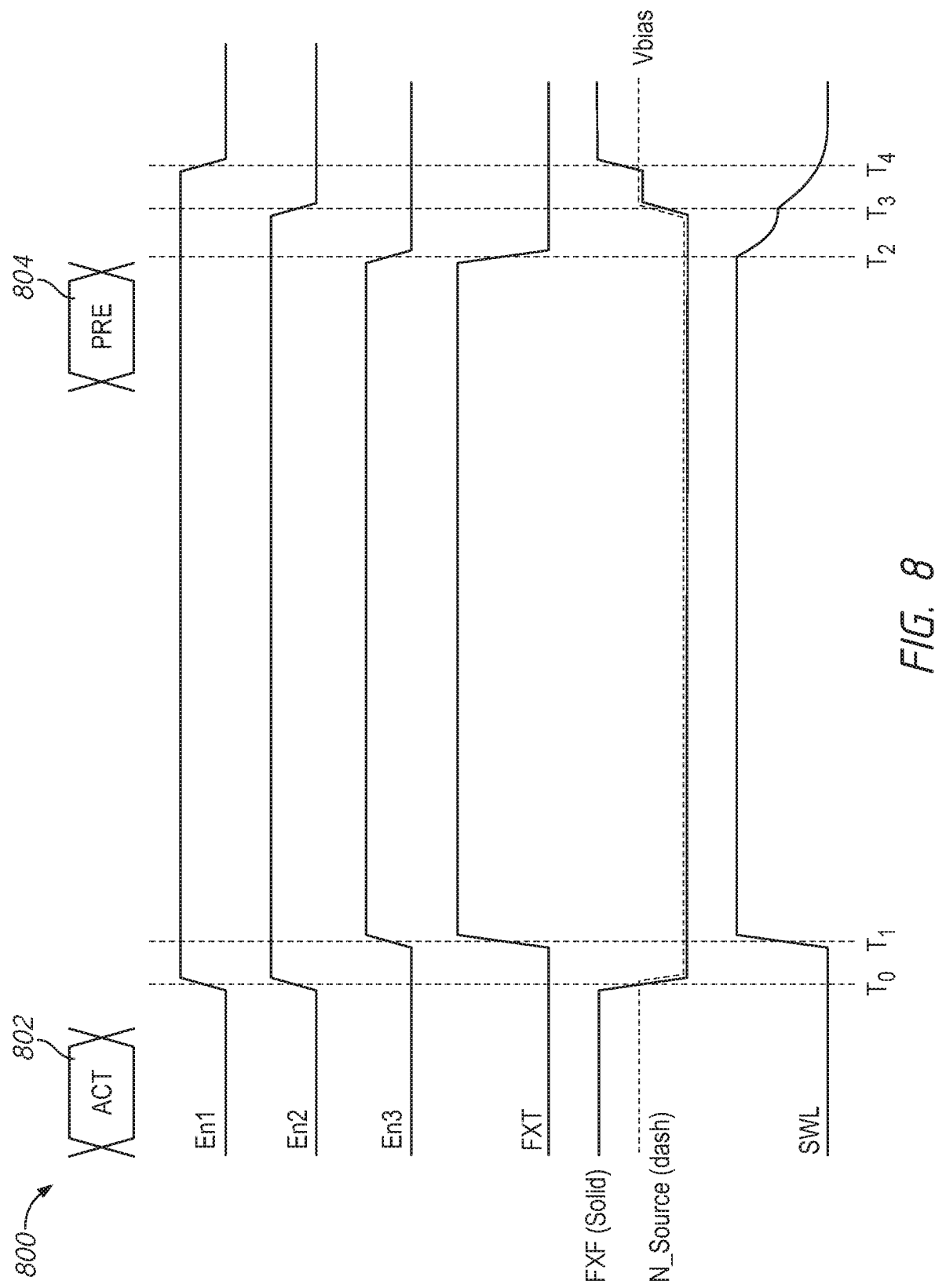
FIG. 8 is a timing diagram of various signals during operation of a driver circuit according to an embodiment of the disclosure.

FIG. 8 is a timing diagram 800 of various signals during an operation of a driver circuit according to an embodiment of the disclosure. In some embodiments of the disclosure, the driver circuit of FIG. 7 may be operated according to the example operation of timing diagram 800. The timing diagram 800 will be described with reference to the driver circuit of FIG. 7. However, the example shown in FIG. 8 is not limited to the specific embodiment of the FXD 700.

Timing diagram 800 shows the states of enable signals En1, En2, and En3, driving signals FXT and FXF, a subword line SWL, and N_source, a voltage at a node of a P-channel type field effect transistor coupled to $V_{bias}$ (e.g., node 735 of P3 in FIG. 7). Although not shown in FIG. 8, it is assumed that an address signal ADD is active during the operation shown in timing diagram 800.

At some time before T0, an activation command 802 is received by a memory device that includes the word driver. An internal activation signal ACT may transition to an active state. The activation signal ACT may be received by enable signal circuit 704, which may activate enable signals En1, En2, and En3 in response to the activated activation signal ACT. Prior to activation of any enable signals, transistor P2 and P3 may be active while transistors N3 and N4 are not active. Thus, FXF may be inactive (e.g., high) and N_source may be at a potential equal to a bias voltage $V_{bias}$. As shown in FIG. 8, $V_{bias}$ may have a potential between VCCP and Gnd in some embodiments.

Around T0, the enable signal circuit 704 may transition enable signals En1 and En2 to an active (e.g., high) state. The active enable signals En1 and En2 activates transistors N3 and N4 and deactivate transistors P2 and P3. This drives FXF to an active (e.g., low) state and N_source to a low potential (e.g., Gnd).

Around T1, the enable signal circuit 704 may transition enable signal En3 to an active (e.g., high) state. The active enable signal En3 may activate transistor P4 and deactivate transistor N5. FXT may be driven to an active (e.g., high) state. As both FXF and FXT are in their active states, SWL is driven to an active (e.g., high state).

Prior to T2, a precharge command 804 may be received by the memory device. Responsive to the pre-charge command 804, the activation signal ACT may transition to an inactive state. Responsive to the inactive activation signal ACT, the enable signal circuit 704 may deactivate (e.g., transition to an inactive state) the enable signals En1, En2, En3.

Around T2, the enable signal circuit 704 may transition enable signal En3 to an inactive (e.g., low) state. The inactive enable signal En3 may deactivate transistor P4 and activate transistor N5, driving FXT to an inactive state. Due to the inactive FXT, the subword line SWL is no longer coupled to VCCP (by FXT) via transistor P1, but is instead coupled to the low potential via transistor P1. Accordingly, SWL begins to discharge from VCCP through transistor P1 to an intermediate subword line voltage. For example, the SWL begins to discharge from VCCP until the potential of SWL is equal to a potential of the main word line MWL plus the threshold voltage $V_{tp}$ of transistor P1. Because FXF is still active low, transistor N2 is inactive, so the rate of discharge of SWL is limited by P1.

Around T3, the enable signal may transition enable signal En2 to an inactive (e.g., low) state. This may deactivate transistor N4 and activate transistor P3. Because transistor N3 is still activated by enable signal En1, FXF and N_source are driven to the bias voltage $V_{bias}$. As a result, $V_{bias}$ may be applied to the gate 715 of transistor N2. Increasing the voltage applied to the gate 715 of transistor N2 to Vbias may permit SWL to continue to discharge from the intermediate subword line potential toward Gnd. The rate of discharge may be based, at least in part, on the value of $V_{bias}$.

Around T4, the enable signal circuit 704 may transition En1 to an inactive (e.g. low) state. This may activate transistor P2 and deactivate transistor N3, driving FXF to an inactive (e.g., high) state. The inactive FXF signal may activate N2, which may permit SWL to discharge quickly to Gnd. Because transistor P3 is still active, N_source may remain at $V_{bias}$.

As shown in FIGS. 6 and 8, the timing of the enable signals may allow control of the driving of the word driver signals FXT and FXF. FXF and FXT need not be driven to their active and/or inactive states at the same time. For example, driving signal FXT may be driven to an active state after FXF is driven to an active state. In another example, FXT may be driven to an inactive state prior to when FXF is driven to an inactive state and/or to an intermediate potential. Furthermore, in conjunction with the word driver control circuitry (e.g., the embodiments shown in FIGS. 5 and 7), the enable signals may allow driving signals FXT and/or FXF to be driven to potentials having values between Gnd and VCCP (e.g., between active and low potentials).

Activating and deactivating the driving signals at different times and/or driving the driving signals to intermediate potentials (e.g., $V_{bias}$) over time may allow control of the discharge of word lines (e.g., subword lines), for example, reducing a rate of discharge of word lines from a high potential to a low potential (e.g., VCCP to Gnd). Furthermore, values of the intermediate potentials may be used to control a rate of discharge of the word lines. Reducing the rate of discharge of word lines may reduce the effects of a row hammer event in some applications.

While reducing the effect of the row hammer event may be desirable, in some embodiments, the gradual (e.g., step-wise) control of driving signals (e.g., FXF) to control the discharge of word lines (e.g., SWL), may require additional circuitry (e.g., transistors, enable signal circuits, bias voltage generators). Accordingly, in some applications, it may be desirable to share one or more of the driving signal control components (e.g., control circuit) amongst multiple word drivers (FXD).

Figure 9:
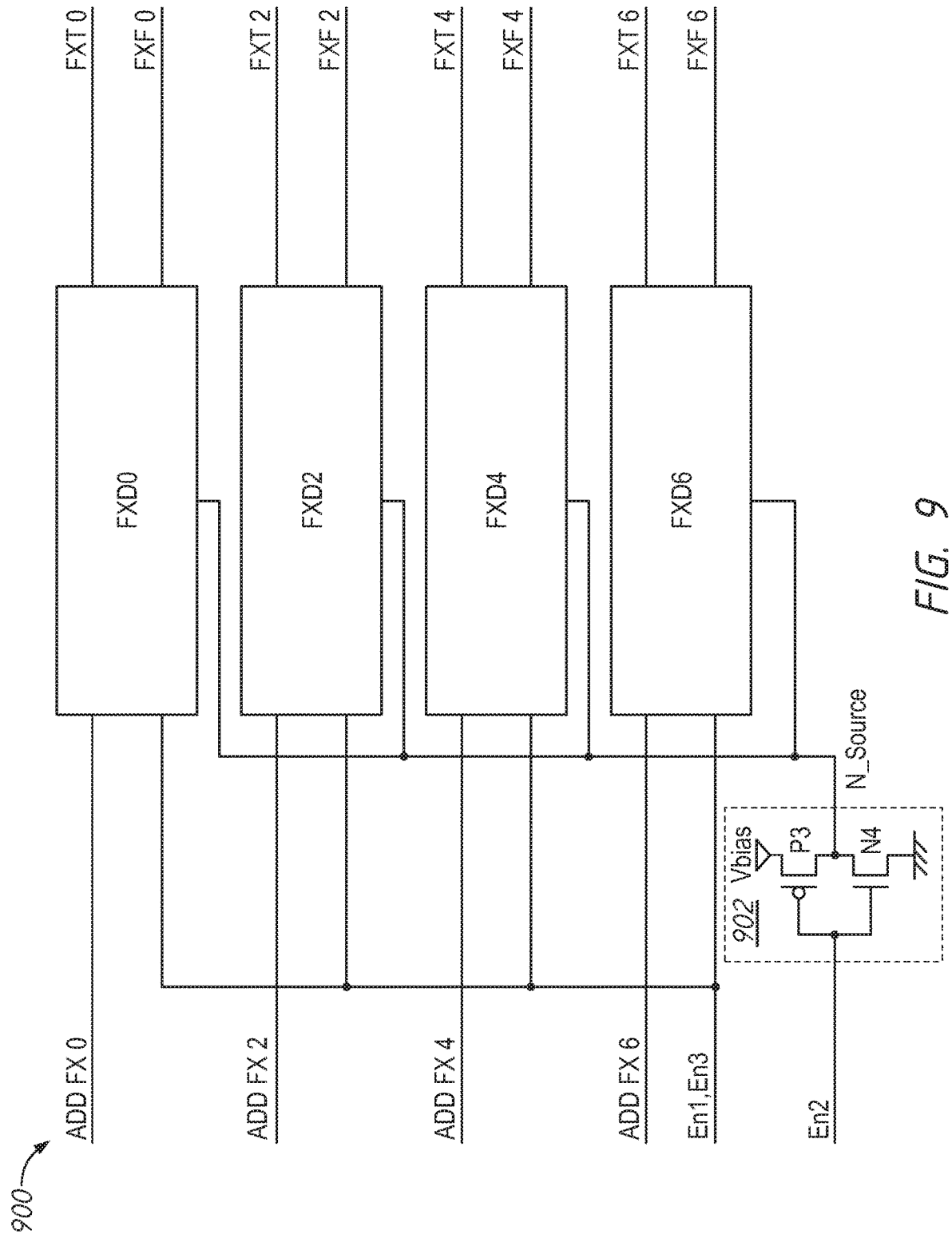
FIG. 9 is a block diagram of a plurality of word drivers according to an embodiment of the disclosure.

FIG. 9 is a block diagram 900 of a plurality of word drivers (FXD0, FXD2, FXD4, and FXD6) according to an embodiment of the disclosure. In some embodiments, each word driver FXD0, FXD2, FXD4, and FXD6 may be implemented by word driver FXD 700 shown in FIG. 7. As shown in FIG. 9, sources of some signals may be shared by word drivers FXD0, FXD2, FXD4, and FXD6. For example, FXD0, FXD2, FXD4, and FXD6 may receive enable signals En1, En3, En2 from a same source (e.g., enable circuit 704 shown in FIG. 7). In some embodiments, a bias voltage $V_{bias}$ and transistors P3 and N4 may be shared amongst the word drivers FXD0, FXD2, FXD4, and FXD6 in addition to enable signal En2. The control circuit (e.g., control components) indicated by box 902 may be equivalent to the components shown in box 790 in FIG. 7 in some embodiments. Accordingly, in some applications, word drivers may be implemented in accordance with the embodiments shown in FIGS. 7 and 9 to reduce a number of additional components required to implement a gradual control of driving signals. While four word drivers are shown sharing enable signals and bias voltages, more or fewer word drivers may share these components in other embodiments.

As shown in FIG. 9, each word driver FXD0, FXD2, FXD4, and FXD6 receives its own address signal ADD FX0 FX2, FX4 FX6. Returning to FIG. 5, the control to access $V_{bias}$ through transistor P3 is based on both enable signal En2 and the address signal ADD. Accordingly, in some embodiments, word drivers implemented according to the embodiment shown in FIG. 5 may not be able to share a bias voltage $V_{bias}$ and/or a transistor coupled to the bias voltage $V_{bias}$. Thus, in some applications, the word driver embodiment shown in FIG. 7 may be desirable as one or more driving signal control components may be shared. However, in some applications, it may be advantageous to drive the driving signal via a P-channel transistor, in which case the word driver shown in FIG. 5 may be desirable.

As shown with reference to FIGS. 5-9, in some embodiments, a word driver may receive a bias voltage. A value of the bias voltage may control, at least in part, a discharge rate of a word line (e.g., subword line). In some embodiments, the bias voltage may be provided by a bias voltage generator.

Figure 10:
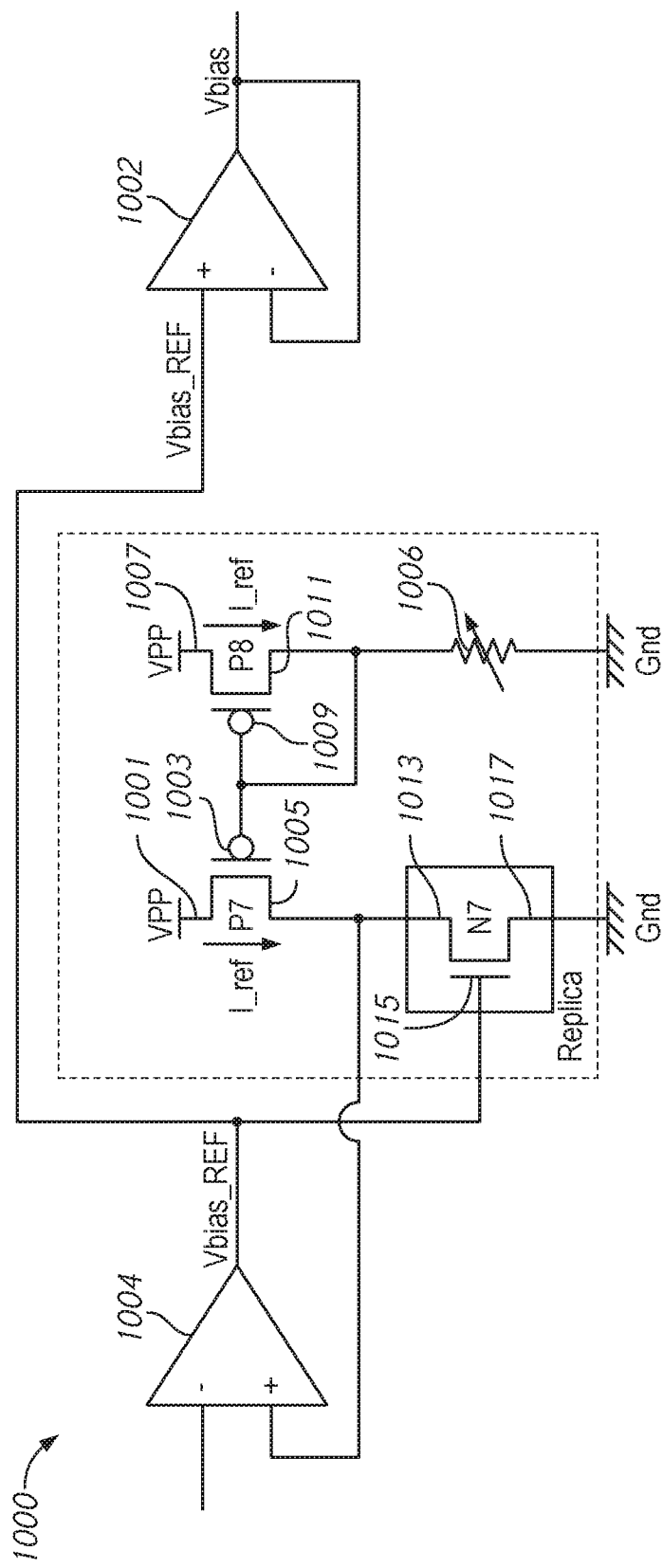
FIG. 10 is a circuit diagram of a bias voltage generator according to an embodiment of the disclosure.

FIG. 10 is a circuit diagram of a bias voltage generator 1000 according to an embodiment of the disclosure. The bias voltage generator 1000 may provide a bias voltage $V_{bias}$. In some embodiments, the bias voltage generator 1000 may be used to provide the bias voltage received by a word driver, such as the word drivers shown in FIGS. 3, 4, 5, 7 and 9.

Bias voltage generator 1000 may include a first operational amplifier (op-amp) 1004. The operational amplifier may receive a reference voltage VREF at a negative input. In some embodiments, VREF may be provided by a voltage generator circuit, such as voltage generator circuit 39 shown in FIG. 1. In some embodiments, VREF may be provided by a separate reference voltage generator. The op-amp 1004 may output a voltage Vbias_REF, which may be provided to a positive input of a second op-amp 1002. The second op-amp 1002 may output bias voltage $V_{bias}$. The bias voltage $V_{bias}$ may feedback into a negative input of the op-amp 1002. The bias generator 1000 may further include P-channel transistors P7 and P8, N-channel transistor N7, and variable resistance 1006 as indicated by the dashed box in FIG. 10.

Transistor P7 may have a node 1001 coupled to a voltage VPP and a node 1005 coupled to a node 1013 of N7. The outputs of nodes 1005 and 1013 may be feedback into a positive input of op-amp 1004. Transistor P8 may also have a node 1007 coupled to the voltage VPP. A gate 1003 of P7 and a gate 1009 of P8 may be coupled together. A node 1011 of P8 may be coupled to the gates 1003 and 1009 of transistors P7 and P8, respectively. The node 1011 of P8 may further be coupled to the variable resistance 1006. The variable resistance 1006 may be coupled to ground, Gnd. A gate 1015 of N5 may receive the output of op-amp 1004. A node 1017 of N7 may be coupled to Gnd. In some embodiments, transistor N7 may be a replica of an N-channel transistor of a subword driver SWD coupled to a word driver line providing driving signal FXF and a subword line (SWL), for example, transistor N2 shown in FIGS. 5 and 7.

In operation, the transistors P7 and P8 may be configured to provide a current mirror with a current I_ref across nodes 1001 and 1005 of P7 and nodes 1007 and 1011 of P8. Transistor N7 may receive Vbias_REF and discharge the voltage VPP across transistor P7 to ground when activated. Vbias_REF may be such that a drain level of N7 may be equal to a level of the negative input node of the op-amp 1004. In other words, I_ref may flow across N7 and the drain level may be equal to the level of the negative input node of op-amp 1004 when the gate 1015 receives Vbias_REF. The resistance of variable resistance 1006 may be adjusted to adjust a voltage of $V_{bias}$. In some embodiments, the bias voltage generator 1000 may be configured to provide a bias voltage between a low potential (e.g., Gnd, VKK) and a high potential (e.g., VCCP). In some embodiments, the second op-amp 1002 may provide stability for $V_{bias}$ when the current drivability of the other components of the bias voltage generator is low.

Figure 11:
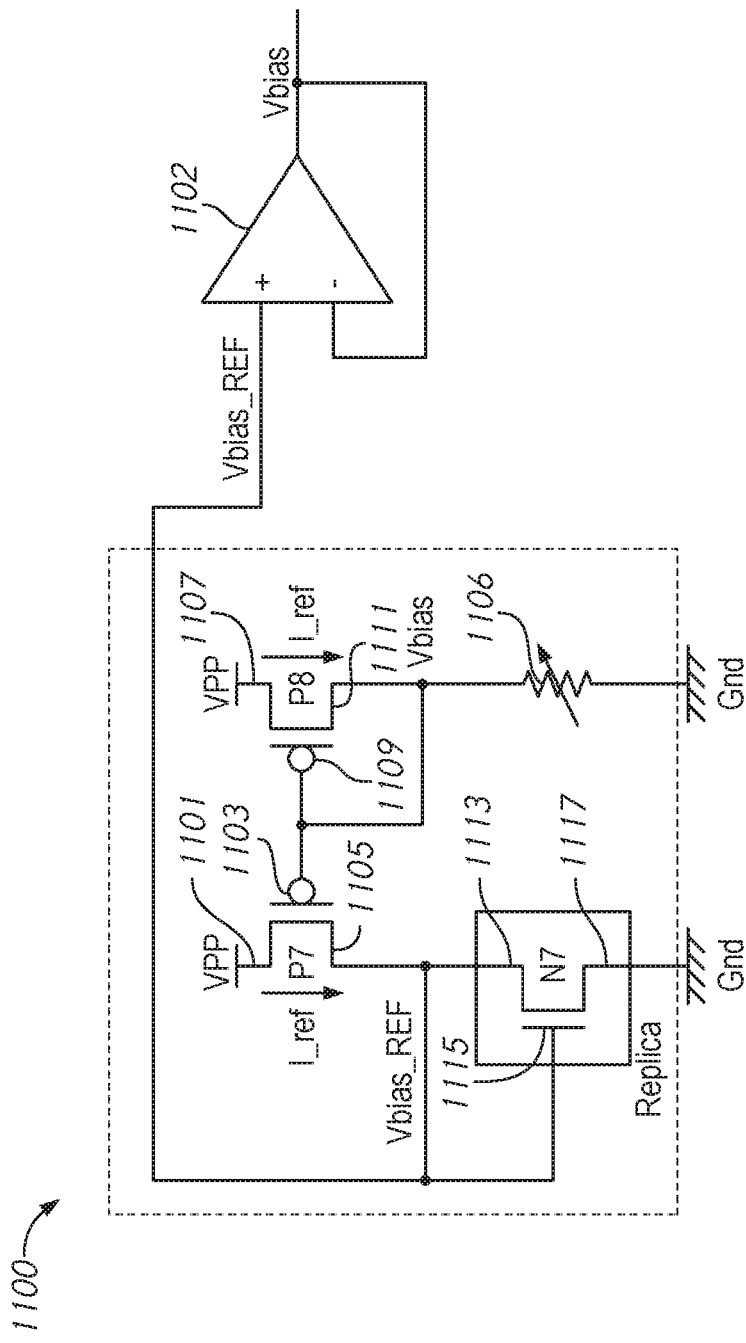
FIG. 11 is a circuit diagram of a bias voltage generator according to an embodiment of the disclosure.

FIG. 11 is a circuit diagram of a bias voltage generator according to an embodiment of the disclosure. The bias voltage generator 1100 may provide a bias voltage $V_{bias}$. In some embodiments, the bias voltage generator 1100 may be used to provide the bias voltage received by a word driver, such as the word drivers shown in FIGS. 3, 4, 5, 7 and 9.

Bias voltage generator 1100 may include an operational amplifier (op-amp) 1102, P-channel transistors P7 and P8, N-channel transistor N7, and variable resistance 1106 as indicated by the dashed box in FIG. 11.

Transistor P7 may have a node 1101 coupled to a voltage VPP and a node 1105 coupled to a node 1113 of N7. The outputs of nodes 1105 and 1013 may be provided to a gate 1115 of N7. The gate 1115 of N7 and the nodes 1105 and 1013 may also be coupled to a positive input of op-amp 1102. Transistor P8 may also have a node 1107 coupled to the voltage VPP. A gate 1103 of P7 and a gate 1109 of P8 may be coupled to one another. A node 1111 of P8 may be coupled to the gates 1103 and 1109 of transistors P7 and P8, respectively. The node 1111 of P8 may further be coupled to the variable resistance 1106. The variable resistance 1106 may be coupled to ground, Gnd. A node 1117 of N7 may also be coupled to Gnd. In some embodiments, transistor N7 may be a replica of an N-channel transistor of a subword driver SWD coupled to a word driver line providing driving signal FXF and a subword line (SWL), for example, transistor N2 shown in FIGS. 5 and 7.

In operation, the transistors P7 and P8 may be configured to provide a current mirror with a current I_ref across nodes 1101 and 1105 of P7 and nodes 1007 and 1011 of P8. Transistor N7 may receive the current I_ref at gate 1115 and also drain the current I_ref across nodes 1113 and 1117 to ground, which generates a voltage Vbias_REF. Vbias_REF may be received by op-amp 1102 at the positive input and the op-amp 1102 may output bias voltage $V_{bias}$. The bias voltage $V_{bias}$ may be fed back into a negative voltage of the op-amp 1102. The op-amp 1102 may provide stability to $V_{bias}$ in some embodiments, similar to op-amp 1002 in FIG. 10. The resistance of variable resistance 1106 may be adjusted to adjust a voltage of $V_{bias}$. In some embodiments, the bias voltage generator 1100 may be configured to provide a bias voltage between a low potential (e.g., Gnd) and a high potential (e.g., VCCP).

The bias voltage generators 1000 and 1100 shown in FIGS. 10 and 11 are provided for exemplary purposes only. In some embodiments, other bias voltage generators may be used to provide a bias voltage to a word driver.

As described herein, a word driver line FXL may be driven in a gradual manner. That is, the word driver line may be driven to one or more intermediate potentials having values between potentials associated with active and inactive states. In some embodiments, the word driver line FXL may be driven in a gradual manner by providing a variety of control signals to a word driver FXD. The control signals may include one or more enable signals and an address signal in some embodiments. The enable signals may be generated in response to an activation signal in some embodiments. FXL may be driven to an intermediate potential between a high potential and a low potential in some embodiments as a "step" between driving between the active and low potentials. Driving FXL in a gradual manner may cause a subword line SWL to discharge in a step-wise manner and/or at a slower rate than if FXL were driven directly between active and low potentials. In some applications, controlling the discharge of the SWL in this manner may reduce the effects of a row hammer event.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a subword driver configured to drive a subword line; and
a word driver configured to provide a first driving signal to the subword driver, wherein the word driver is further configured to drive the first driving signal to an intermediate potential for a duration of time when driving the first driving signal between an active state and an inactive state, wherein the intermediate potential has a value between a high potential and a low potential.

2. The apparatus of claim 1, wherein the word driver further provides a second driving signal to the subword driver, wherein the word driver drives the second driving signal to an active state at a different time from when the word driver drives the first driving signal to the active state.

3. The apparatus of claim 2, wherein the second driving signal is driven to the active state after the first driving signal is driven to the active state.

4. The apparatus of claim 2, wherein the word driver drives the second driving signal to an inactive state at a different time from when the word driver drives the first driving signal to the inactive state.

5. The apparatus of claim 4, wherein the second driving signal is driven to the inactive state before the first signal is driven to the inactive state.

6. The apparatus of claim 1, further comprising a bias voltage generator configured to provide a bias voltage to the word driver, wherein the intermediate potential is based, at least in part, on the bias voltage.

7. The apparatus of claim 1, wherein the word driver is configured to receive at least one enable signal and drive the first driving signal to the intermediate potential responsive to the at least one enable signal.

8. The apparatus of claim 7, wherein the at least one enable signal includes a first enable signal and a second enable signal, wherein:
the first driving signal is driven to the active state when the first enable signal and the second enable signal are in active states;
the first driving signal is driven to the inactive state when the first enable signal and the second enable signal are in inactive states; and
the first driving signal is driven to the intermediate potential when the first enable signal is in the inactive state and the second signal is in the active state.

9. The apparatus of claim 8, wherein the at least one enable signal includes a third enable signal and the word driver further provides a second driving signal to the subword driver, wherein the second driving signal is driven to an active state when the third enable signal is in an active state and the second driving signal is driven to an inactive state when the third enable signal is in an inactive state.

* * * * *